United States Patent [19]

Nakamura

[11] 4,306,253
[45] Dec. 15, 1981

[54] SUPPORTING DEVICE FOR A PICTURE TUBE

[75] Inventor: Koji Nakamura, Nagaokakyo, Japan

[73] Assignee: Mitsubishi Denki Kabushiki Kaisha, Tokyo, Japan

[21] Appl. No.: 116,606

[22] Filed: Jan. 24, 1980

[30] Foreign Application Priority Data

Jan. 25, 1979 [JP] Japan .................................. 54-8075
Apr. 17, 1979 [JP] Japan .................................. 54-47795

[51] Int. Cl.³ ............................................ H04N 5/645
[52] U.S. Cl. .................................. 358/248; 358/254; 312/7.2
[58] Field of Search ....................... 358/254, 248, 245; 312/7 TV

[56] References Cited

U.S. PATENT DOCUMENTS 3,404,227 10/1968 Alcala et al. ........................ 358/245

FOREIGN PATENT DOCUMENTS 50-41798 11/1976 Japan .................................. 358/248
197708 3/1975 U.S.S.R. ............................. 358/245

Primary Examiner—Robert L. Richardson
Assistant Examiner—Edward L. Coles
Attorney, Agent, or Firm—Wenderoth, Lind & Ponack

[57] ABSTRACT

A supporting device of a picture tube, which is, for example, of the type used in a television set mounted in an aircraft, wherein a shield or supporting member of the tube is connected to the tube at least at either one of the funnel and neck portions of the tube by resilient means so as to reduce the vibration of the tube and to minimize the size of the tube.

7 Claims, 6 Drawing Figures

SUPPORTING DEVICE FOR A PICTURE TUBE

BACKGROUND OF THE INVENTION

This invention relates to a supporting device for a picture tube, for example, used in a television set, and particularly to a device which is particularly useful when the space for the picture tube is limited and the tube is exposed to vibration.

Recently, the performance of color picture tubes has developed so markedly, that the conventional monochrome picture tube is used only for special purposes or when cheapness is the only requirement. When changing a monochrome picture tube to a color picture tube, it is desirable to position the latter within the same space as provided for the former. Accordingly it has been necessary to minimize the size of the mounting parts in order to fit the tube within a certain space.

FIG. 1 shows a general construction of a conventional color picture tube schematically. The picture tube 1 comprises a panel 2 having a fluorescent screen on its inner surface, a funnel 3, and a neck 4 including an electron gun (not shown), with all said members being in a single body. A metal band 5 for the purpose of preventing implosion is wound around the outer surface of the panel 2, and a fitting member 6 for mounting the tube 1 extends outside of the band 5, and the member is secured to the band 5 with some of its portions interposed between the band 5 and panel 2. Accordingly dimension D in FIG. 1 is comparatively large in spite of the fact that dimension d is not so large.

Furthermore, in the conventional device, the transmission of vibration from outside to the tube is not prevented or absorbed. A shadow mask 7 is suspended in front of the fluorescent screen of the panel 2 by means of leaf springs (not shown) fixed to the inner side surface of the panel 2. This shadow mask 7 is exposed to resonance vibration at certain frequencies caused by vibration transmitted from outside through the fitting 6. In an extreme case, the shadow mask 7 is vibrated by some hundreds of $\mu m$, causing the electron beams, and therefore the shadows of the shadow mask, to be shaken so that undesirable chromatic aberration is induced.

SUMMARY OF THE INVENTION

It is an object of the invention to provide a supporting device for a picture tube which can reduce the chromatic aberration caused by vibration of the shadow mask.

It is another object of the invention to provide a supporting device for the tube the size of which is minimized so as to allow installation within a confined space.

The present invention comprises a supporting device for a picture tube which is characterized in that a shield or supporting member for the tube is arranged with a gap between it and the tube, and the shield or supporting member is held on the tube by a resilient means which connects the shield or supporting member to at least either the funnel or neck portion of the tube.

In one embodiment of the invention the resilient means is a resilient layer of silicone resin, and in another embodiment the resilient means is a plurality of resilient layers which have different values of solidity. In a preferable embodiment a first resilient layer of silicone resin is sandwiched between two other second resilient layers, and the two second resilient layers preferably have lesser solidity than that of the first layer. However an embodiment which has only one second layer is also included in the invention. By providing a plurality of voids or slits in the layer, the vibration absorbing characteristic can be further improved.

BRIEF DESCRIPTION OF THE DRAWINGS

The above brief description, as well as further objects, features and advantages of the present invention, will be more fully understood by reference to the following detailed description of the presently preferred, but nontheless illustrative, embodiment in accordance with the present invention when taken in conjunction with the accompanying drawings, wherein.

DESCRIPTION OF THE PREFERRED EMBODIMENT

Figure 2:
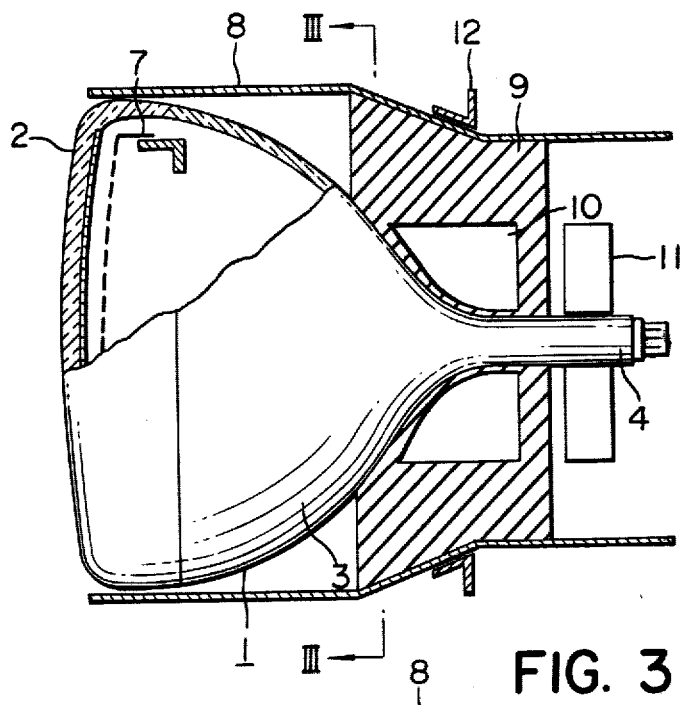
FIG. 2 is a schematic side view of the supporting device for a picture tube according to the present invention partly in section.

Referring now to FIG. 2 of the drawings, a picture tube 1 comprises a panel 2 having a fluorescent screen on its inner surface, a funnel 3, and a neck 4 including an electron gun (not shown), with all said members being in a single body. This tube 1 does not have a band for preventing implosion. The tube 1 is covered by a shield 8 or supporting member for the tube, which is made of permalloy and has a thickness of 0.8 mm, with a small gap or space between the tube and the shield so that the tube does not abut the shield. The tube 1 is supported in the shield 8 by filling up the space between the shield 8 and the funnel 3 and neck 4 of the tube 1 with a resilient layer 9 of at least 5 mm thickness and of, for example, silicone resin. Around the neck 4 of the tube, a deflecting yoke 10, which is enveloped by the layer 9, and a neck assembly 11 are disposed. A fitting member 12 is fixed to the outside of the shield 8 in the longitudinal position near the neck 4 of the tube. However the fitting member 12 can be made as a part of the shield 8.

As a result of experiments with the above described device, the vibration transmitted to the tube is reduced to about one tenth that of the conventional tube. This result is achieved because the layer 9 which has a thickness of at least 5 mm absorbs the vibration. If the layer 9 is disposed between the outer surface of the panel 2 and the shield 8 and is about 1 mm thick, the vibration can not be sufficiently absorbed and is transmitted to the tube.

Figure 1:
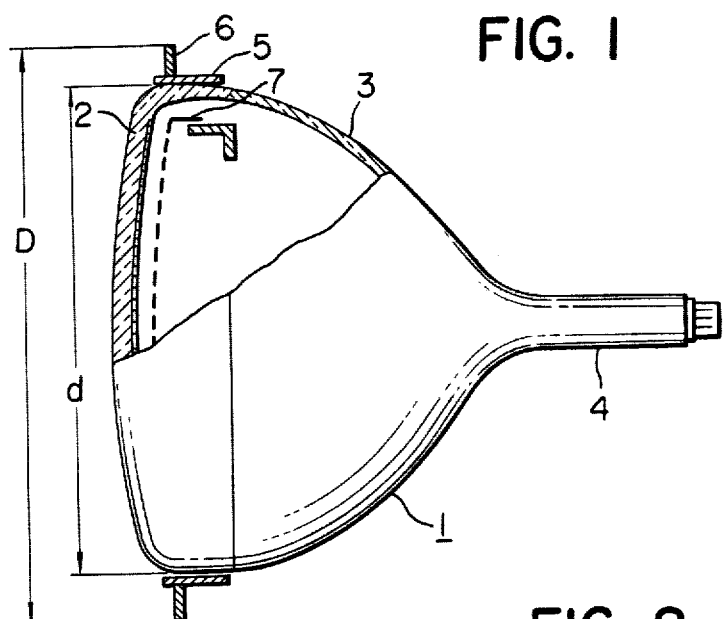
FIG. 1 is a schematic side view of a conventional picture tube and its supporting device partly in section, which has been described above.

The other effect of the embodiment is that dimension D (which is shown in FIG. 1) becomes smaller because the fitting member 12 is disposed on the shield 8 at the position around the neck 4 which has a smaller diameter than that of the position around the panel 2. Accordingly this embodiment is advantageous when the space for positioning the tube is limited.

Figure 3:
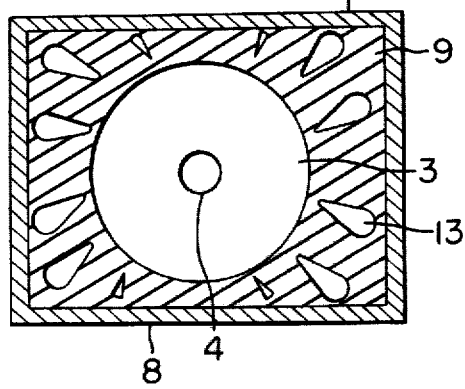
FIG. 3 is a sectional view taken along line III—III, showing an embodiment of a resilient layer.

In the above description, the layer 9 is described as being made of silicone resin, but other resilient plastics or springs can be used. In the embodiment shown in FIG. 2 the layer 9 grips the tube 1 at both neck 4 and funnel 3, but this could be limited to either one of them if the tube 1 is small, since the weight of the panel 2 and funnel 3 is reduced in proportion to the size of the tube 1. Anyhow the position of the layer 9 should preferably be in the neighborhood of the center of gravity of the tube as long as the thickness of the layer 9 can be adequately provided. The same is true for the position of the fitting member 12. Furthermore a plurality of voids 13 can be provided in the resilient layer 9 as shown in FIG. 3 which is a sectional view taken along line III—III of FIG. 2. The voids 13 are provided for the purpose of efficiently further absorbing vibration transmitted from the shield 8.

Figure 4:
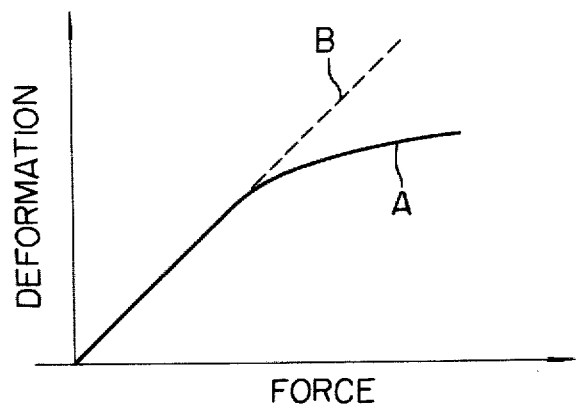
FIG. 4 is a diagram showing the relations between the force and the deformation of the two embodiments of the invention.

FIG. 4 is a diagram which shows the relation between the force transmitted to the layer 9 from the shield 8 and the deformation caused by the force. Line A in the drawing represents the relation when the layer 9 is fully filled with silicone resin, and the line B represents the same when voids 13 are formed in the layer 9. In the case of line A even when the force exceeds a certain magnitude the deformation does not increase in accordance with the force (which means that vibration is apt to be transmitted easily), on the other hand in the case of line B the layer does not lose its resilience characteristic even when the force exceeds said magnitude so that it absorbs vibration efficiently over a wide range of the force.

Figure 5:
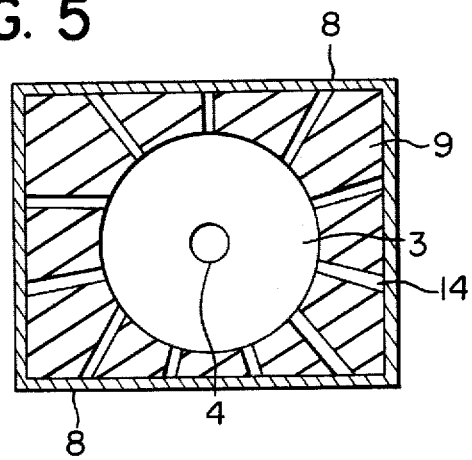
FIG. 5 is a sectional view similar to FIG. 3 showing another embodiment of a resilient layer.

FIG. 5 shows another embodiment of the layer. In this embodiment the layer 9 is divided by slits 14 into a plurality of sections. With this embodiment, the same effect is obtained as with the embodiment shown in FIG. 3.

Figure 6:
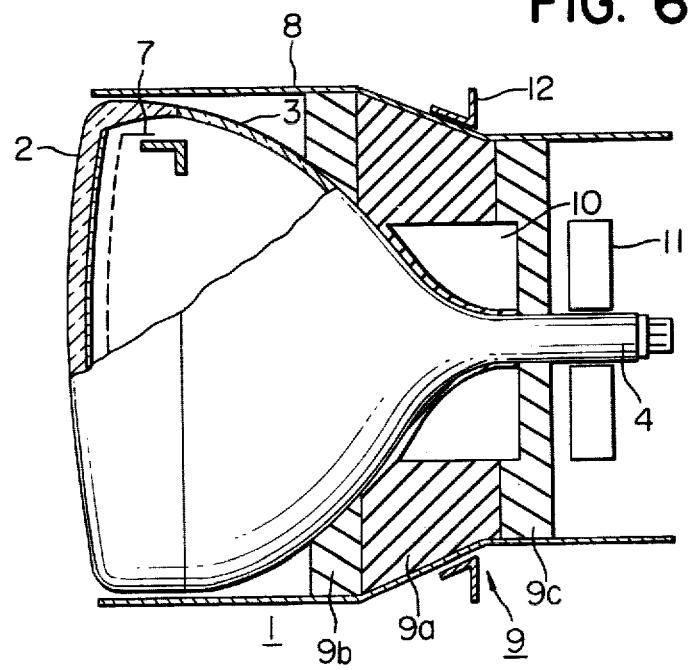
FIG. 6 is a schematic side view of another embodiment of the present invention.

FIG. 6 shows another embodiment of the invention. In the drawing the reference numbers used are the same as for each corresponding member shown in FIG. 2. The only difference from the embodiment shown in FIG. 2 is that the layer 9 comprises a layer 9a of silicone resin and another two resilient layers 9b and 9c between which sandwich the silicone layer 9a is sandwiched. The resilient layers 9b and 9c have lower solidity than that of silicone resin and, for example, are made of "MOLTPLANE" marketed by "BRIDGESTONE CO LTD".

This embodiment has better vibration absorbing characteristics than the aforementioned embodiments since the vibration is absorbed not only by the resilient layer 9a but also by the resilient layers 9a and 9c.

The method for producing the structure of the layer 9 shown in FIG. 6 is as follows. The shield 8 is at first set in a certain position with respect to the tube 1 by means of an assembling jig, and then the layer 9b is inserted into the space between the tube 1 and shield 8 from the neck side (from right to left in FIG. 6). Then yoke 10 and neck-assembly 11 are fixed to the neck 4 and the other layer 9c is inserted, forming the space for the layer 9a. Finally silicone resin is poured into the space between the two layers 9b and 9c through an opening in the shield causing the layer 9a to be formed in the space.

In another method the two layers 9b and 9c can be initially formed in a body which has a space for the layer 9a into which silicone resin is poured.

Further it is to be understood that even if one of the additional resilient layers 9b and 9c is omitted from the layer 9 shown in FIG. 6, nearly the same effect is obtained, and if it is the layer 9c that is omitted the method of production is facilitated since silicone resin can be poured easily from the side of the neck 4 with the neck being positioned upward.

In the above description the effects of the invention are described as being that by absorbing vibration, the characteristics of the shadow mask of a color picture tube are improved. However this invention is also effective for use with mono-chrome picture tubes, since the variation of the electron gun is also markedly reduced.

It will now be apparent that according to this invention the undesirable influences of vibration transmitted from outside are removed by absorbing the vibration in the resilient layer disposed between the tube and the shield, and yet because the layer is disposed round the neck or funnel portion which has a smaller diameter, the size of the tube is kept small. Accordingly chromatic aberration is reduced and deteriorations in the dimensional characteristics of the picture tube are prevented.

As will be readily apparent to those skilled in the art, the present invention may be embodied in other specific forms without departing from its spirit or essential characteristics. The present embodiment is, therefore, to be considered as illustrative and not restrictive, the scope of the invention being indicated by the claims rather than by the foregoing description, and all changes which come within the meaning and range of equivalents of the claims are therefore intended to be embraced therein.

What is claimed is:

1. A supporting device for supporting and positioning a picture tube within a shield member surrounding at least a funnel portion and a neck portion of said picture tube with a predetermined gap between said shield and said picture tube, said device comprising a first and at least one second resilient layer against each other in said gap between said shield member and said funnel and said neck portions of the picture tube and extending from the outer surface of said picture tube to the inner surface of said shield member in a radial direction relative to said picture tube, said second resilient layer having a greater resiliency than said first resilient layer.

2. A supporting device as claimed in claim 1, further comprising a further second resilient layer having a greater resiliency than said first layer on the opposite side thereof from said first-mentioned second resilient layer, said first resilient layer sandwiched between said second resilient layers.

3. A supporting device as claimed in claim 1 or 2, wherein said resilient layers have therein a plurality of voids extending parallel to the longitudinal direction of said picture tube.

4. A supporting device as claimed in claim 1 or 2, wherein said resilient layers are formed of silicone resin.

5. In combination:
a picture tube having a neck portion and a funnel portion within which a center of gravity of said picture tube falls;
a shield member surrounding at least said funnel and neck portions of said picture tube with a gap formed between the outer surface of said funnel and neck portions of said picture tube and the inner surface to said shield member;
a resilient member extending from the outer surface of said picture tube to the inner surface of said shield member for supporting and positioning said picture tube within said shield member, said resilient member being in the neighborhood of said center of gravity of the picture tube; and a mounting member fixed to said shield member at a position on the outer surface of said shield member which is substantially in registry with said center of gravity of the picture tube.

6. The combination as claimed in claim 5, wherein said resilient member has therein a plurality of voids extending parallel to the longitudinal direction of said picture tube.

7. The combination as claimed in claim 5 or 6, wherein said resilient member comprises a silicone resin layer.

* * * * *